US012509765B2

(12) United States Patent
Hatanpää et al.

(10) Patent No.: US 12,509,765 B2
(45) Date of Patent: Dec. 30, 2025

(54) METHOD AND SYSTEM FOR DEPOSITING TRANSITION METAL CARBIDE

(71) Applicant: ASM IP Holding B.V., Almere (NL)

(72) Inventors: Timo Hatanpää, Espoo (FI); Paloma Ruiz Y Kärkkäinen, Helsinki (FI); Mikko Ritala, Espoo (FI); Anton Vihervaara, Helsinki (FI); Matti Putkonen, Espoo (FI)

(73) Assignee: ASM IP Holding B.V., Almere (NL)

( * ) Notice: Subject to any disclaimer, the term of this patent is extended or adjusted under 35 U.S.C. 154(b) by 66 days.

(21) Appl. No.: 18/438,765

(22) Filed: Feb. 12, 2024

(65) Prior Publication Data

US 2024/0279800 A1 Aug. 22, 2024

Related U.S. Application Data

(60) Provisional application No. 63/445,733, filed on Feb. 15, 2023.

(51) Int. Cl.
*C23C 16/32* (2006.01)
*C23C 16/455* (2006.01)

(52) U.S. Cl.
CPC ........ *C23C 16/32* (2013.01); *C23C 16/45527* (2013.01); *C23C 16/45553* (2013.01)

(58) Field of Classification Search
CPC .............. C23C 16/32; C23C 16/45527; C23C 16/45553; C23C 16/45523; C23C 16/08
See application file for complete search history.

(56) References Cited

U.S. PATENT DOCUMENTS

2008/0102204 A1* 5/2008 Elers ........................ C23C 16/32 427/249.1

FOREIGN PATENT DOCUMENTS

WO WO-2014210512 A1 * 12/2014 ....... C23C 16/45553

OTHER PUBLICATIONS

Plasma enhanced atomic layer deposition of molybdenum carbide and nitride with bis(tert-butylimido)bis(dimethylamido) molybdenum, Adam BertuchBrent et al, Journal of Vacuum Science & Technology A: Vacuum, Surfaces, and Films 35, 01B141 (2017); doi: 10.1116/1.4972776.
Synthesis of Molybdenum Containing Thin Films Using Organic Reducing Agents and Synthesis of Magnesium Silyl Intermediate Complexes for Use in Atomic Layer Deposition, Michael David Overbeek (2022).
Tailored Molybdenum Carbide Properties and Graphitic Nano Layer Formation by Plasma and Ion Energy Control during Plasma Enhanced ALD, Eldad Grady et al, arXiv:1911.05046v1 [physics.app-ph] Nov. 12, 2019.

(Continued)

*Primary Examiner* — Michael G Miller
(74) *Attorney, Agent, or Firm* — Laine IP Oy

(57) ABSTRACT

The present disclosure relates to methods and apparatuses for depositing transition metal carbide-containing material on a substrate by a cyclic deposition process. The method comprises providing a substrate in a reaction chamber, providing a transition metal precursor into the reaction chamber in a vapor phase; and providing a second precursor into the reaction chamber in a vapor phase to form transition metal carbide-containing material on the substrate. The second precursor comprises a cyclic diene compound comprising a substituent comprising metalloid.

24 Claims, 2 Drawing Sheets

(56) References Cited

OTHER PUBLICATIONS

Figure 1A:
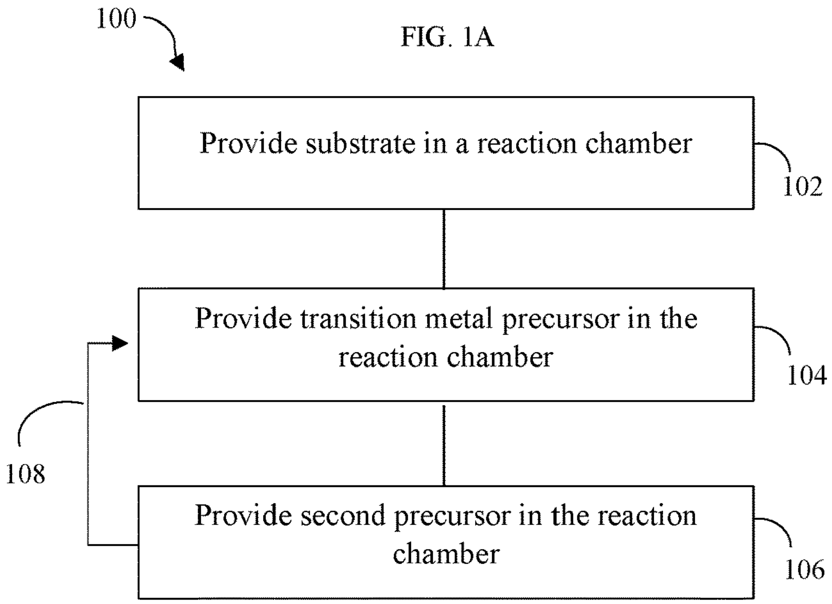

Thermal atomic layer deposition of molybdenum carbide films using bis(ethylbenzene)molybdenum and H2, Ji Sang Ahn et al., J. Vac. Sci. Technol. A 41, 012405 (2023); https://doi.org/10.1116/6.0002308.

Ultralow-Resistivity Molybdenum-Carbide Thin Films Deposited by Cyclopentadienyl-Based Precursor, Min-Ji Ha et al, Chem. Mater. 2022, 34, 2576-2584.

* cited by examiner

METHOD AND SYSTEM FOR DEPOSITING TRANSITION METAL CARBIDE

CROSS-REFERENCE TO RELATED APPLICATIONS

This application claims priority to and the benefit of U.S. Provisional Application No. 63/445,733, filed Feb. 15, 2023, the entirety of which is incorporated by reference herein.

PARTIES OF JOINT RESEARCH AGREEMENT

The invention claimed herein was made by, or on behalf of, and/or in connection with a joint research agreement between University of Helsinki and ASM Microchemistry Oy. The agreement was in effect on and before the date the claimed invention was made, and the claimed invention was made as a result of activities undertaken within the scope of the agreement.

FIELD OF INVENTION

The present invention relates to methods and systems for the manufacture of semiconductor devices. More particularly, the disclosure relates to methods and assemblies for depositing transition metal carbide material on a substrate by a cyclical deposition process, and layers comprising transition metal carbide material.

BACKGROUND OF THE DISCLOSURE

Transition metal carbides (TMCs) are widely used in catalytic and wear resistance applications. They exhibit excellent chemical and thermal stabilities, exceptional hardnesses, and low resistivities. Additionally, they typically have good electromigration resistances. These properties make them relatively good conductors as their metal wire dimensions shrink to the sub-10 nm range. Development of TMC ALD processes opens the possibility to use carbides in semiconductor applications. The ALD of metal carbides is, however, still in its infancy, and current challenges include a lack of thermal ALD processes, high process temperatures, and low growth rates. Transition metal carbides, such as molybdenum carbides, $MoC_x$, have the potential to improve the performance, efficiency, and reliability of semiconductor devices. Recently, they have emerged as potential candidates for diffusion barriers, interconnects, and gate electrodes.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Various embodiments of the present disclosure relate to method of depositing transition metal carbide-containing material on a substrate, to a transition metal carbide layer, to a semiconductor structure and a device containing said layer, and to deposition assemblies for depositing transition metal carbide-containing material on a substrate.

In a first aspect, a method for forming a layer comprising transition metal carbide on a substrate by a cyclic deposition process is disclosed. The method comprises providing a substrate into a reaction chamber and executing at least one deposition cycle. Each deposition cycle comprises providing a transition metal halide precursor in vapor phase into a reaction chamber and providing a second precursor in vapor phase into a reaction chamber to form a layer comprising transition metal halide on a substrate. In the method, the second precursor comprises a cyclic diene compound comprising a substituent comprising a metalloid.

In another aspect, a transition metal carbide layer produced by a cyclic deposition process is disclosed. The cyclic deposition process comprises providing a substrate in a reaction chamber, providing a transition metal halide precursor into the reaction chamber in a vapor phase, and providing a second precursor into the reaction chamber in a vapor phase to form transition metal halide on the substrate. In the process, the second precursor comprises a cyclic diene compound comprising a substituent comprising a metalloid.

In a further aspect, a semiconductor structure comprising transition metal carbide layer produced by a cyclic deposition process is disclosed. The cyclic deposition process comprises providing a substrate in a reaction chamber, providing a transition metal halide precursor into the reaction chamber in a vapor phase, and providing a second precursor into the reaction chamber in a vapor phase to form transition metal halide on the substrate. In the process, the second precursor comprises a cyclic diene compound comprising a substituent comprising a metalloid.

In yet another aspect, a semiconductor device comprising transition metal carbide layer produced by a cyclic deposition process is disclosed. The cyclic deposition process comprises providing a substrate in a reaction chamber, providing a transition metal halide precursor into the reaction chamber in a vapor phase, and providing a second precursor into the reaction chamber in a vapor phase to form transition metal halide on the substrate. In the process, the second precursor comprises a cyclic diene compound comprising a substituent comprising a metalloid.

In an additional aspect, a deposition assembly for depositing transition metal carbide on a substrate is disclosed. The deposition assembly comprises one or more reaction chambers constructed and arranged to hold the substrate, a precursor injector system constructed and arranged to provide a transition metal halide precursor and a second precursor into the reaction chamber in a vapor phase, wherein the second precursor comprises a cyclic diene compound comprising a substituent comprising metalloid. The deposition assembly further comprises a precursor vessel constructed and arranged to contain a transition metal halide precursor, and the assembly is constructed and arranged to provide the transition metal halide precursor and the second precursor via the precursor injector system to the reaction chamber to deposit transition metal carbide on the substrate.

In this disclosure, any two numbers of a variable can constitute a workable range of the variable, and any ranges indicated may include or exclude the endpoints.

Additionally, any values of variables indicated (regardless of whether they are indicated with “about” or not) may refer to precise values or approximate values and include equivalents, and may refer to average, median, representative, majority, or the like. Further, in this disclosure, the terms “including,” “constituted by” and “having” refer independently to “typically or broadly comprising,” “comprising,” “consisting essentially of,” or “consisting of” in some embodiments. In this disclosure, any defined meanings do not necessarily exclude ordinary and customary meanings in some embodiments.

BRIEF DESCRIPTION OF THE DRAWING FIGURES

Figure 1B:
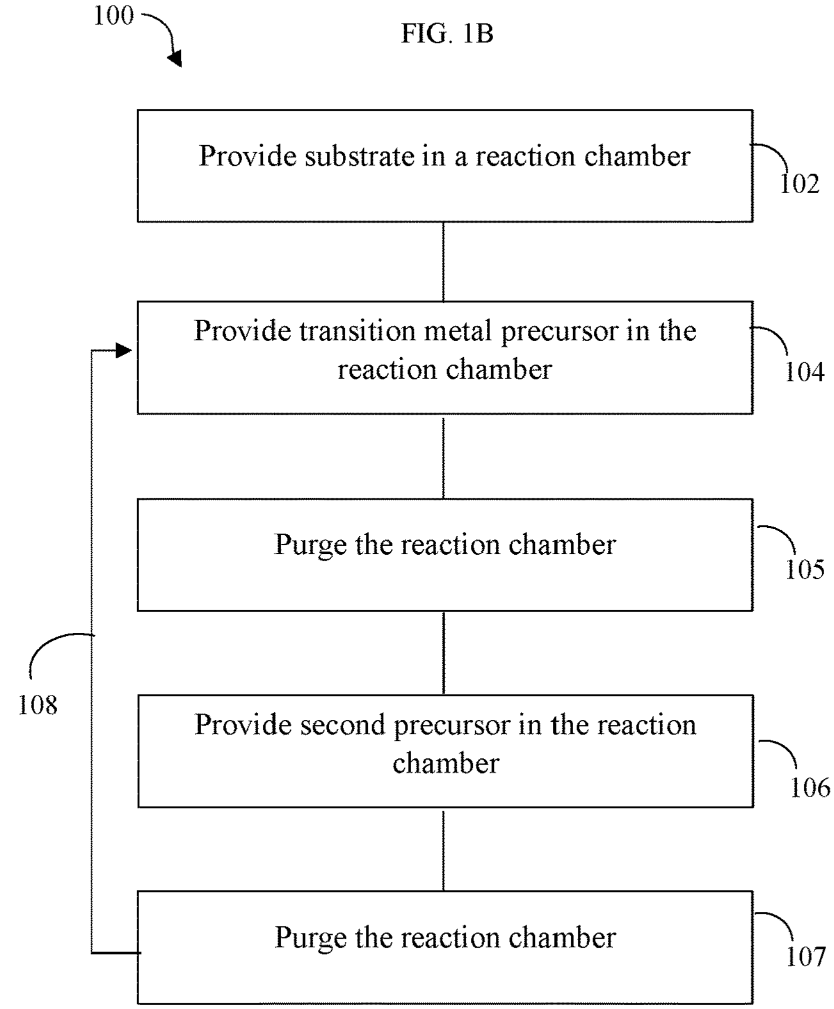

The accompanying drawings, which are included to provide a further understanding of the disclosure and constitute a part of this specification, illustrate exemplary embodiments, and together with the description help to explain the principles of the disclosure. In the drawings FIGS. 1A and 1B illustrate a block diagram of exemplary embodiments of a method according to the current disclosure.

Figure 2:
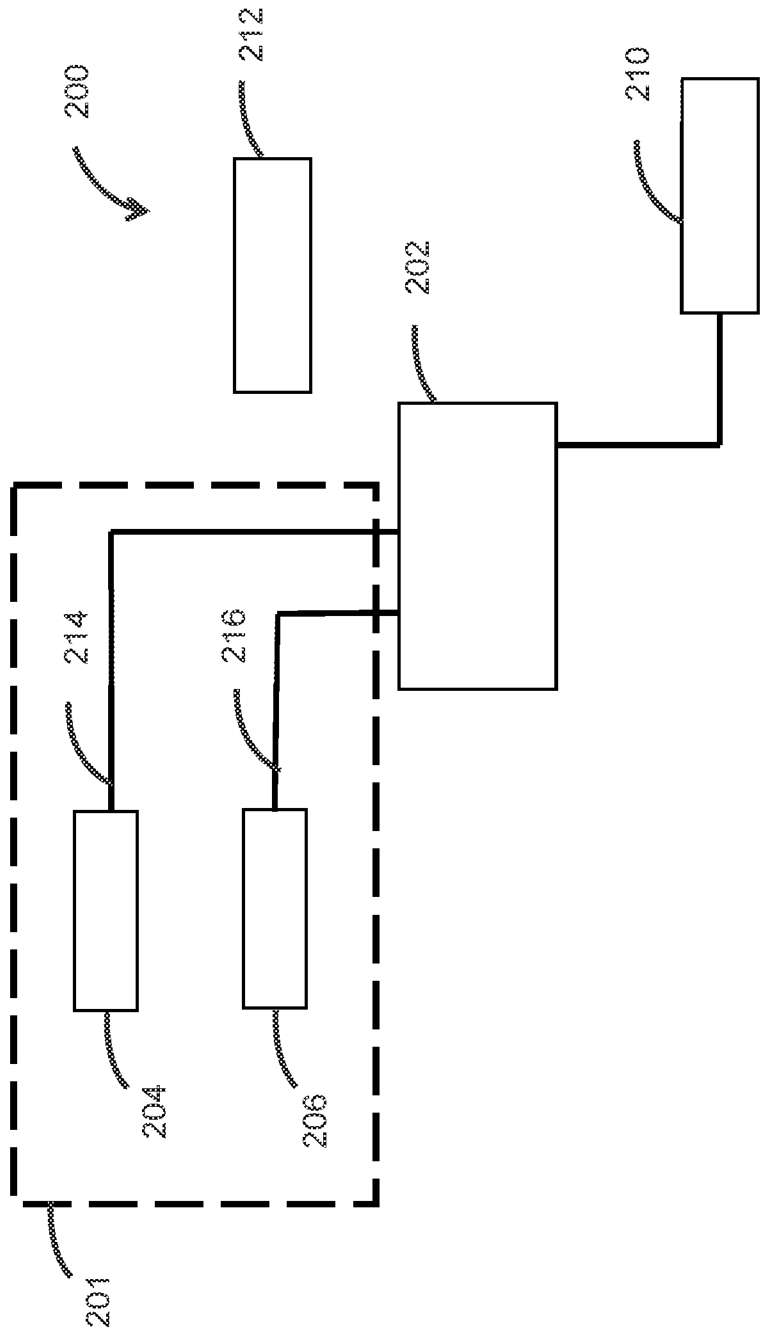

FIG. 2 is a schematic presentation of a deposition assembly according to the current disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

In the deposition methods according to the current disclosure, transition metal carbide material is deposited. Thus, the material deposited according to the current disclosure comprises carbidic transition metal. By carbidic transition metal is herein meant carbon that is bonded to the transition metal. This does not for example include carbon impurities found in the deposited material. In some embodiments, the material deposited according to the current disclosure consists essentially of, or consists of transition metal carbide. In some embodiments, at least 60% of transition metal carbide is deposited as carbidic transition metal. In some embodiments, at least 80% or at least 90% of transition metal carbide is deposited as carbidic transition metal. In some embodiments, the transition metal carbide may additionally comprise nitrogen. In some embodiments, the transition metal carbide comprises transition metal carbonitride. In one embodiment, the transition metal carbide has the structure according to the general formula MCN, wherein M is the transition metal. In some embodiments, the layer comprising transition metal carbide does not comprise metallic transition metal. In one embodiment, the transition metal carbide has the structure according to the general formula MC, wherein M is the transition metal. In one embodiment, the transition metal carbide has the structure according to the general formula $M_2C$, wherein M is the transition metal.

The composition of material deposited according to the current disclosure may vary, depending on the process. In some embodiments, the material deposited according to the current disclosure comprises at least one more element in addition to the target transition metal carbide. Such materials may have different properties than metals that are useful in some applications. In some embodiments, a transition metal carbide-containing material may comprise, for example, at least about 60 atomic percentage (at. %) of the target transition metal carbide, or at least about 75 at. % of the target transition metal carbide, or about 75 to about 95 at. % of the target transition metal carbide, or about 75 to about 89 at. % of the target transition metal carbide. A transition metal carbide-containing material deposited by a method according to the current disclosure may comprise, for example at least about 80 at. %, about 85 at. %, about 87 at. %, about 90 at. %, about 95 at. %, about 97 at. % or about 99 at. % of the target transition metal carbide. In some embodiments, a transition metal carbide-containing material may consist essentially of, or consist of the target transition metal carbide. Material consisting of transition metal carbide may include an acceptable amount of impurities, such as nitrogen, oxygen, chlorine or other halogen, and/or hydrogen that may originate from one or more precursors used to deposit the transition metal carbide-containing material.

In some embodiments, the transition metal carbide-containing material may comprise less than about 30 at. %, less than about 20 at. %, less than about 10 at. %, less than about 8 at. %, less than about 7 at. %, less than about 5 at. %, or less than about 2 at. % oxygen. In some embodiments, the transition metal carbide-containing material may comprise less than about 20 at. %, less than about 15 at. %, less than about 10 at. %, less than about 8 at. %, less than about 6 at. %, less than about 5 at. %, less than 4.5 at. %, or less than about 3 at. % impurity carbon. In some embodiments, the transition metal carbide-containing material may comprise less than about 8 at. %, less than 5 at. %, less than 3 at. % or less than about 2 at. % of germanium.

In some embodiments, the transition metal carbide-containing material may form a layer. In such embodiments, transition metal carbide forms a transition metal carbide layer. As used herein, a “transition metal carbide layer” can be a material layer that contains transition metal carbide. As used herein, the term “layer” and/or “film” can refer to any continuous or noncontinuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a noncontinuous layer serving to increase the rate of nucleation of another material. However, the seed layer may also be substantially or completely continuous.

As used herein, the term “substrate” may refer to any underlying material or materials that may be used to form, or upon which, a device, a circuit, material or a material layer may be formed. A substrate can include a bulk material, such as silicon (such as single crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The current disclosure relates to deposition of materials from a vapor phase. Thus, gaseous transition metal precursor and second precursor are used in the methods according to the current disclosure.

In this disclosure, "gas" can include material that is a gas at normal temperature and pressure (NTP), a vaporized solid and/or a vaporized liquid, and can be constituted by a single gas or a mixture of gases, depending on the context. A transition metal precursor may be provided to the reaction chamber in gas phase. A second precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the current disclosure, the deposition process may comprise a cyclic deposition process, such as an atomic layer deposition (ALD) process or a cyclic chemical vapor deposition (CVD) process. The term "cyclic deposition process" can refer to the sequential introduction of precursor (s) and/or reactant(s) into a reaction chamber to deposit material, such as a metal or semimetal-containing material, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of a transition metal precursor and second may be repeated. In some embodiments, the process comprises or one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. In some embodiments, auxiliary reactant may be provided in the reaction chamber continuously.

The term "atomic layer deposition" (ALD) can refer to a vapor deposition process in which deposition cycles, such as a plurality of consecutive deposition cycles, are conducted in a reaction chamber. Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a transition metal precursor into the reaction chamber. In some embodiments, the cyclic deposition process comprises purging the reaction chamber after providing a second precursor into the reaction chamber. In some embodiments, the cyclic deposition process comprises purging the reaction chamber after providing any precursor or reactant into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

Without limiting the current disclosure to any specific theory, in some embodiments it may be possible to produce layers with low resistivity, especially when transition metal carbide is deposited. The resistivity of a metal layer according to the current disclosure may be less than 400 μΩ cm or less than 320 μΩ cm or less than 250 μΩ cm. For example, the resistivity of a transition metal carbide layer according to the current disclosure may be from about 5 μΩ cm to about 520 μΩ cm, from about 5 μΩ cm to about 350 μΩ cm, or from about 5 μΩ cm to about 300 μΩ cm, or from about 5 μΩ cm to about 250 μΩ cm.

In some embodiments, the deposited layer is superconductive. By superconductive it is meant the property of certain materials to conduct direct current (DC) electricity without energy loss when they are cooled below a critical temperature (referred to as $T_c$). In some embodiments, the deposited layer is superconductive at critical temperature between 2.9 and 4.4. K. At a film thickness of about 69 nm the critical temperature is about 3.3 K. At a film thickness of about 37 nm the critical temperature is about 3.2 K. At a film thickness of about 18 nm the critical temperature is about 2.9 K.

In some embodiments, the reaction chamber is purged after providing a transition metal precursor and/or a second precursor therein. As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 1 s, 2 s or 3 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the cyclic deposition process according to the current disclosure comprises a thermal deposition process. In thermal deposition, the chemical reactions are promoted by increased temperature relevant to ambient temperature. Generally, temperature increase provides the energy needed for the formation of transition metal carbide-containing material in the absence of other external energy sources, such as plasma, radicals, or other forms of radiation. In some embodiments, the cyclic deposition process according to the current disclosure is a fully thermal process, i.e. it does not comprise plasma steps. However, in some embodiments, the method comprises at least one plasma-enhanced step. In some embodiments, the method according to the current disclosure is a plasma-enhanced deposition method, for example PEALD or PECVD.

The methods according to the current disclosure comprise providing a substrate in a reaction chamber, providing a transition metal precursor into the reaction chamber in a vapor phase, and providing a second precursor into the reaction chamber in a vapor phase to form transition metal carbide-containing material on the substrate.

The method of depositing transition metal carbide-containing material according to thnite current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously. A reaction chamber according to the current disclosure may further be a deposition station in a multi-station chamber.

Further, in the method according to the current disclosure, a transition metal precursor is provided into the reaction chamber in a vapor phase, and a second precursor is provided into the reaction chamber in a vapor phase to form a transition metal carbide-containing material on the substrate.

In the method according to the current disclosure, the transition metal precursor may be in vapor phase when it is in a reaction chamber. The transition metal precursor may be partially gaseous or liquid, or even solid at some points in time prior to being provided in the reaction chamber. In other words, a transition metal precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof. Thus, the method according to the current disclosure may comprise heating the transition metal precursor prior to providing it to the reaction chamber.

In some embodiments, the deposition of a transition metal carbide-containing material according to the current disclosure is performed at a temperature below about 400° C., or below about 380° C., or below about 360° C. In some embodiments, the deposition is performed at a temperature from about 240° C. to about 310° C., for example from about 200° C. to about 300° C., such as at a temperature of about 250° C., about 275° C. or at about 300° C. In some embodiments, the deposition is performed at a temperature from about 250° C. to about 450° C., for example from about 300° C. to about 400° C., such as at a temperature of about 325° C., about 350° C., about 375° C., 400° C., about 425° C. or at about 425° C.

In some embodiments, a transition metal precursor is heated to at least 30° C., to at least 50° C., or to at least 70° C., or to at least 90° C. or to at least 100° C. or to at least 110° C. before providing it to the reaction chamber. In some embodiments, a transition metal precursor is heated to at least 70° C., or to at least 75° C. The heating may take place in a precursor vessel. In some embodiments, the transition metal precursor is heated to at most 110° C., or to at most 100° C., or to at most 90° C., or to at most 80° C., before providing it to the reaction chamber. The injector system of a vapor deposition assembly may be heated to improve the vapor-phase delivery of the transition metal precursor to the reaction chamber.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may mean element or a compound that is not incorporated into the resulting compound or element to a significant extent. However, a reactant may also contribute to the resulting compound or element in certain embodiments, or it may modify the properties of the deposited material.

As used herein, "a transition metal precursor" includes a gas or a material that can become gaseous and that can be represented by a chemical formula that includes the target transition metal. By a target transition metal is meant the transition metal in the transition metal carbide that is intended to be deposited. Examples of target transition metals include, such as early transition metals, late transition metals, lanthanide series metals and post-transition metals.

In some embodiments, the transition metal precursor comprises a transition metal for depositing transition metal carbide on the substrate. In some embodiments, the transition metal precursor comprises a group 4 to 8 transition metal for depositing group 4 to 8 transition metal carbide on the substrate. In some embodiments, the transition metal in the transition metal precursor is selected from the group consisting of molybdenum (Mo), chromium (Cr), tungsten (W), nickel (Ni), cobalt (Co), niobium (Nb), copper (Cu), titanium (Ti), palladium (Pd), platinum (Pt), zirconium (Zr), hafnium (Hf), vanadium (V), tantalum (Ta), manganese (Mn), rhodium (Rh), iron (Fe), iridium (Ir) and rhenium (Re). In some embodiments, the transition metal in the transition metal precursor is selected from a group consisting of chromium (Cr), molybdenum (Mo) and tungsten (W). In some embodiments, the transition metal in the transition metal precursor is selected from a group consisting of scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd). In some embodiments, the transition metal in the transition metal precursor is selected from a group consisting of molybdenum (Mo), chromium (Cr), tungsten (W), nickel (Ni), cobalt (Co), niobium (Nb), rhenium (Re), copper (Cu), gold (Au), titanium (Ti), palladium (Pd), platinum (Pt), rhodium (Rh) and ruthenium (Ru). In some embodiments, the metal precursor comprises a lanthanide group metal for depositing lanthanide series metal carbide on the substrate. In some embodiments, the transition metal in the transition metal precursor is selected from a group consisting of chromium (Cr), molybdenum (Mo), niobium (Nb) and tungsten (W). In some embodiments, the transition metal in the transition metal precursor may be molybdenum (Mo). In some embodiments, the transition metal in the transition metal precursor may be niobium (Nb). In some embodiments, the transition metal precursor consists only of the transition metal and halogen. In some embodiments, the transition metal precursor comprises transition metal, halogen and an adduct forming ligand.

In some embodiments, the transition metal precursor is a transition metal halide precursor. In some embodiments, the transition metal halide consists of only transition metal and halogen. In some embodiments, the halogen in the transition metal halide is selected from the group consisting of chlorine, iodine, fluorine and bromine. In some embodiments, the transition metal halide precursor comprises molybdenum pentachloride. In some embodiments, the transition metal halide precursor comprises niobium pentafluoride.

In some embodiments, transition metal precursor is provided in a mixture of two or more compounds. In a mixture, the other compounds in addition to the transition metal precursor may be inert compounds or elements. In some embodiments, transition metal precursor is provided in a composition. Compositions suitable for use as composition can include a transition metal compound and an effective amount of one or more stabilizing agents. Composition may be a solution or a gas in standard conditions.

In some embodiments, the second precursor is a reducing agent. A reducing agent may reduce the transition metal of the transition metal precursor into elemental metal. In some embodiments, the second precursor is a carbon donor. A carbon donor may give a carbon atom to the transition metal of the transition metal precursor to form transition metal carbide. In some embodiments, the second precursor acts both as a reducing agent and a carbon donor. In some embodiments, the second precursor is a nitrogen donor. A nitrogen donor may give a nitrogen atom to the transition metal of the transition metal precursor to form transition metal nitride. In some embodiments, the second precursor acts both as a reducing agent and a nitrogen donor. In some embodiments, the second precursor acts both as a reducing agent, a carbon donor and a nitrogen donor.

For simplicity of nomenclature, the term cyclic diene encompasses ring structures comprising only carbon, as well as ring structures comprising one or two nitrogen atoms. In some embodiments, the cyclic diene is a five or six membered cyclic diene. Thus, in addition to the metalloid groups, the cyclic diene ring may have additional substituents. In some embodiments, one or more of the ring carbons have an alkyl substituent. The alkyl substituents may be linear or branched. In some embodiments, one ring carbon has a C1 to C7 alkyl substituent. In some embodiments, two ring carbons have a C1 to C7 alkyl substituent. In some embodiments, three ring carbons have a C1 to C7 alkyl substituent. In some embodiments, four ring carbons have a C1 to C7 alkyl substituent. If a germanium atom or silicon atom is attached to the cyclic diene through a carbon atom, the same carbon atom may have an additional alkyl substituent. In some embodiments, all the additional substituents to ring carbons are C1 to C4 alkyls. In some embodiments, all of the additional substituents are methyl or ethyl groups. In some embodiments, all of the additional substituents are methyl groups. In some embodiments, all of the additional substituents are ethyl groups. In some embodiments, the cyclohexadiene compound has one additional substituent, and the additional substituent is a methyl group. In some embodiments, the cyclic diene compound has one additional substituent, and the additional substituent is an ethyl group. In some embodiments, the methyl group is attached to a carbon adjacent to a germanium group bonded carbon atom. In some embodiments, however, none of the ring carbons have additional substituents.

Increasing molecular weight of the cyclic diene compound generally adversely impacts its volatility. Thus, the more substituents the cyclic diene ring comprises, the smaller they need to be to retain sufficient volatility.

Structure of the metalloid group. In some embodiments, the two metalloid groups of the cyclohexadiene compound are trialkylmetalloid groups. In some embodiments, the two trialkylmetalloid groups comprise C1 to C7 alkyl groups. The alkyl groups may be linear or branched. In some embodiments, the two metalloid groups of the cyclic diene compound are trimethylmetalloid groups. In some embodiments, the two metalloid groups of the cyclohexadiene compound are triethylmetalloid groups.

In some embodiments, the cyclohexadiene compound according to the current disclosure has a structure according to formula (VI), wherein M is a metalloid. In some embodiments, the cyclohexadiene compound according to the current disclosure has a structure according to formula (VII), wherein M is a metalloid. In some embodiments, the cyclohexadiene compound according to the current disclosure has a structure according to formula (VIII), wherein M is a metalloid. In some embodiments, the cyclohexadiene compound according to the current disclosure has a structure according to formula (IX), wherein M is a metalloid. In some embodiments, the cyclohexadiene compound according to the current disclosure has a structure according to formula (X), wherein M is a metalloid. In some embodiments, the cyclohexadiene compound according to the current disclosure has a structure according to formula (XI), wherein M is a metalloid. In some embodiments, the metalloid is selected from the group consisting of germanium and silicon.

(VI)

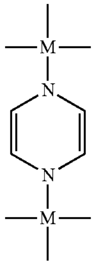

(VII)

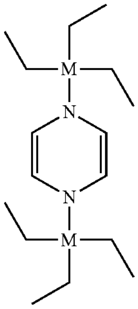

(VIII)

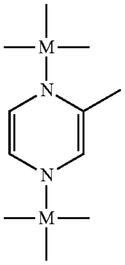

(IX)

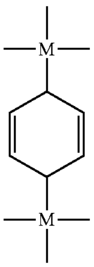

(X)

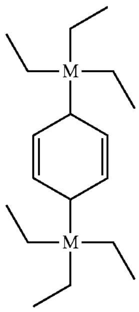

-continued (XI)

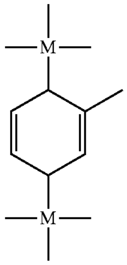

In some embodiments, the cyclohexadiene compound according to the current disclosure has a structure according to formula (XII), (XII)

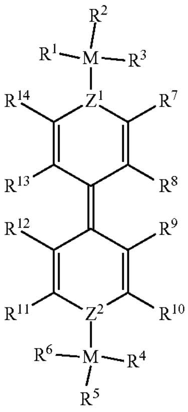

wherein M is a metalloid, each of $Z^1$ and $Z^2$ is independently selected from $CR^{14}$ and N, each of $R^1$ to $R^{14}$, is independently H, C1 to C7 linear or branched alkyl, C6 to C10 aryl or C6 to C14 heteroaryl. In one embodiment, $R^{11}$ is H. In one embodiment, each of $R^7$ to $R^{14}$ is independently selected from a group consisting of H, C1 to C4 linear and branched alkyls and phenyl. In one embodiment all of R7 to R14 are H. In one embodiment, each of R1 to R6 is independently selected from a group consisting of H, methyl, ethyl, n-propyl and isopropyl. In one embodiment, wherein all of R1 to R6 are methyl.

In one embodiment, the second precursor is 1,4-bis(trimethylgermyl)-1,4-dihydropyrazine. In one embodiment, the second precursor is 1,4-bis(trimethylsilyl)-1,4-dihydropyrazine. In one embodiment, the second precursor is 1,1'-bis(trimethylsilyl)-1,1'-dihydro-4,4'-bipyridine. In one embodiment, the second precursor is 1,1'-bis(trimethylgermyl)-1,1'-dihydro-4,4'-bipyridine.

Similarly to the transition metal precursor, a second precursor may be heated before providing it to the reaction chamber. The temperature to which the second precursor is heated depends on the properties of the second precursor. As is understood by those skilled in the art, the vaporization temperatures of the transition metal precursor and the second precursors may need to be compatible.

In some embodiments, a second precursor is heated to at least 20° C., to at least 25° C. to at least 50° C., or to at least 70° C., or to at least 90° C. or to at least 100° C. or to at least 110° C. before providing it to the reaction chamber. The heating may take place in a precursor vessel. In some embodiments, the second precursor is heated to at most 120°

C., or to at most 100° C., or to at most 80° C., or to at most 60° C. before providing it to the reaction chamber. The injector system of a vapor deposition assembly may be heated to improve the vapor-phase delivery of the second precursor to the reaction chamber.

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

The particular implementations shown and described are illustrative of the invention and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

FIGS. 1A and 1B illustrate a block diagram of an exemplary embodiment of a method 100 of depositing transition metal carbide-containing material on a substrate. In the first phase 102, a substrate is provided into a reaction chamber. A substrate according to the current disclosure may comprise, for example, an oxide, such as silicon oxide (for example thermal silicon oxide or native silicon oxide). A substrate may comprise a nitride, such as silicon nitride or titanium nitride, a metal, such as copper, cobalt or tungsten, chalcogenide material, such as molybdenum sulfide. The transition metal carbide-containing material according to the current disclosure may be deposited on said surfaces.

The reaction chamber can form part of an atomic layer deposition (ALD) assembly. The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The transition metal carbide-containing material according to the current disclosure may be deposited in a cross-flow reaction chamber. The transition metal carbide-containing material according to the current disclosure may be deposited in a showerhead reaction chamber.

Transition metal precursor is provided in the reaction chamber containing the substrate 104. Without limiting the current disclosure to any specific theory, transition metal precursor may chemisorb on the substrate during providing transition metal precursor into the reaction chamber. The duration of providing transition metal precursor into the reaction chamber (transition metal precursor pulse time) may be, for example, 0.1 seconds, 0.5 seconds, 1 second, 1.5 seconds, 2 seconds, 3 seconds, 4 seconds or 5 seconds.

In the second deposition phase 106 of a method 100, a second precursor is provided in the reaction chamber. In some embodiments, the second precursor comprises a reducing agent and a carbon donor for simultaneously reducing the transition metal precursor and depositing transition metal carbide on the substrate. In some embodiments, the second precursor comprises a reducing agent, a carbon donor and a nitrogen donor for simultaneously reducing the transition metal precursor and deposition transition metal carbonitride on the substrate. In some embodiments, the second precursor comprises a carbon precursor for depositing transition metal carbide on the substrate. The duration of providing second precursor into the reaction chamber (second precursor pulse time) may be, for example, 0.5 seconds, 1 second, 1.5 seconds, 2 seconds, 3 seconds, 4 seconds or 5 seconds.

Phases of providing a transition metal precursor 104 and providing a second precursor 106 may be performed in any order. The phases of providing a transition metal precursor 104 and providing a second precursor 106 may constitute a deposition cycle, resulting in the deposition of transition metal carbide-containing material. In some embodiments, the two phases of transition metal carbide-containing material deposition, namely providing the transition metal precursor and the second precursor in the reaction chamber (104 and 106), may be repeated (loop 108). Such embodiments contain several deposition cycles. The thickness of the deposited transition metal carbide-containing material may be regulated by adjusting the number of deposition cycles. The deposition cycle (loop 108) may be repeated until a desired transition metal carbide-containing material thickness is achieved. For example, about 50, 100, 200, 300, 400, 500, 700, 800, 1,000, 1,200, 1,500, 2,000, 2,400 or 3,000 deposition cycles may be performed. The cyclical deposition may result in the formation of a transition metal carbide-containing layer. The layer may be substantially continuous or continuous.

In some embodiments, the cyclic deposition process comprises providing the transition metal precursor and the second precursor alternately and sequentially in the reaction chamber. In some embodiments, the reaction chamber is purged between precursors, 105, 107, as depicted in FIG. 1B. In such embodiments, a deposition cycle may be considered to contain phases 104, 105, 106 and 107. As above, a deposition cycle may be repeated 108 a number of times to achieve desired transition metal carbide-containing material thickness.

Transition metal precursor and second precursor may be provided in the reaction chamber in separate steps (104 and 106). FIG. 1B illustrates an embodiment according to the current disclosure, where steps 104 and 106 are separate by purge steps 105 and 107. In such embodiments, a deposition cycle comprises one or more purge steps 103, 105. During purge steps, precursor and/or reactant can be temporally separated from each other by inert gases, such as argon (Ar), nitrogen (N2) or helium (He) and/or a vacuum pressure. The separation of transition metal precursor and second precursor may alternatively be spatial.

Purging the reaction chamber 103, 105 may prevent or mitigate gas-phase reactions between a transition metal precursor and a second precursor, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a transition metal precursor and a second precursor. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, transition metal carbide-containing material is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a transition metal precursor and a second precursor. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant or precursor and the periodic pulsing of the other chemical component into the reaction chamber. The temperature and/or pressure within a reaction chamber during step 104 can be the same or similar to any of the pressures and temperatures noted above in connection with step 102.

In some embodiments, the transition metal precursor is brought into contact with a substrate surface 104, excess transition metal precursor is partially or substantially completely removed by an inert gas or vacuum 105, and second precursor is brought into contact with the substrate surface comprising transition metal precursor. Transition metal precursor may be brought in to contact with the substrate surface in one or more pulses 104. In other words, pulsing of the transition metal precursor 104 may be repeated. The transition metal precursor on the substrate surface may react with the second precursor to form transition metal carbide-containing material on the substrate surface. Also pulsing of the second precursor 106 may be repeated. In some embodiments, second precursor may be provided in the reaction chamber first 106. Thereafter, the reaction chamber may be purged 105 and transition metal precursor provided in the reaction chamber in one or more pulses 104.

FIG. 2 illustrates a deposition assembly 200 according to the current disclosure in a schematic manner. Deposition assembly 200 can be used to perform a method as described herein and/or to form a structure or a device, or a portion thereof as described herein.

In the illustrated example, deposition assembly 200 includes one or more reaction chambers 202, a precursor injector system 201, a transition metal precursor vessel 204, a second precursor vessel 206, an exhaust source 210, and a controller 212. The deposition assembly 200 may comprise one or more additional gas sources (not shown), such as an inert gas source, a carrier gas source and/or a purge gas source.

Reaction chamber 202 can include any suitable reaction chamber, such as an ALD or CVD reaction chamber as described herein.

The transition metal precursor vessel 204 can include a vessel and one or more transition metal precursors as described herein—alone or mixed with one or more carrier (e.g., inert) gases. A second precursor vessel 206 can include a vessel and a second precursor as described herein—alone or mixed with one or more carrier gases. Although illustrated with two source vessels 204, 206, deposition assembly 200 can include any suitable number of source vessels. Source vessels 204, 206 can be coupled to reaction chamber 202 via lines 214,216, which can each include flow controllers, valves, heaters, and the like. In some embodiments, the transition metal precursor in the transition metal precursor vessel 204 and the second precursor in the second precursor vessel 206 may be heated. In some embodiments, a vessel is heated so that a precursor or a reactant reaches a temperature between, for example, about 30° C. and about 140° C., depending on the properties of the chemical in question.

Exhaust source 210 can include one or more vacuum pumps.

Controller 212 includes electronic circuitry and software to selectively operate valves, manifolds, heaters, pumps and other components included in the deposition assembly 200. Such circuitry and components operate to introduce precursors, reactants and purge gases from the respective sources. Controller 212 can control timing of gas pulse sequences, temperature of the substrate and/or reaction chamber 202, pressure within the reaction chamber 202, and various other operations to provide proper operation of the deposition assembly 200. Controller 212 can include control software to electrically or pneumatically control valves to control flow of precursors, reactants and purge gases into and out of the reaction chamber 202. Controller 212 can include modules such as a software or hardware component, which performs certain tasks. A module may be configured to reside on the addressable storage medium of the control system and be configured to execute one or more processes.

Other configurations of deposition assembly 200 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 202. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 200, substrates, such as semiconductor wafers (not illustrated), are transferred from, e.g., a substrate handling system to reaction chamber 202. Once substrate(s) are transferred to reaction chamber 202, one or more gases from gas sources, such as precursors, reactants, carrier gases, and/or purge gases, are introduced into reaction chamber 202.

In some embodiments, the transition metal precursor is supplied in pulses, the second precursor is supplied in pulses and the reaction chamber is purged between consecutive pulses of a transition metal precursor and a second precursor.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

In an exemplary deposition process, molybdenum carbide was deposited using molybdenum pentachloride as the transition metal precursor and 1,4-bis(trimethylgermyl)-1,4-dihydropyrazine as the second precursor. In the example, the second precursor was a reducing agent and a carbon donor able to reduce the molybdenum of the transition metal precursor and donate carbon to it to form molybdenum carbide. In the example, a flow-type (i.e. cross-flow) ALD reactor was used. The pressure inside the reactor was from about 0.5 Torr to about 10 Torr during the process. The deposition process was performed at a temperature from about 250° C. to about 300° C. In an exemplary deposition process, a temperature of 275° C. was used. The transition metal precursor was provided in the reaction chamber (i.e. pulsed) from about 0.2 seconds to about 2 seconds, such as for 0.5 about second. The second precursor may be provided into the reaction chamber for about 1 seconds to about 5 seconds, such as for 3 about seconds. The process comprised a purge phase after each precursor pulsing phase. The length of the purge may be from about 0.2 to 3 seconds, such as for about 1 second.

$N_2$ (5.0) was used as a carrier gas and as a purge gas. The transition metal precursor was vaporized at a temperature between 75 and 85° C., and the second precursor was vaporized at a temperature between 40 and 49° C. Deposition was performed on soda lime glass and on silicon substrates with a native oxide layer. The growth rate of the transition metal carbide-containing material was approximately 1.0 Å/cycle, such as about 1.5 Å/cycle. Molybdenum carbide-containing layers may be obtained by the process, and the thickness of the layer depends on the number of pulsing cycles. For example, layers having thickness of at least 10 nm, such as at least 50 nm may be obtained.

In the exemplary process, the deposited transition metal carbide-containing material comprised crystalline hexagonal or cubic molybdenum carbide, as analyzed via XRD measurements and had a stoichiometry of MoC. The resistivity of the molybdenum carbide-containing layers was approximately between 200 and 380 μΩ cm. The resistivity of the molybdenum carbide-containing layers was approximately 200 μΩ cm when the thickness of the layer was 100 nm. A conductive layer could be achieved at a layer thickness of about 12 nm and the layers were mostly pinhole-free when they exceeded 56 nm in thickness. Based on SEM imaging, the grain size was deemed small, and the layers to be smooth with XRR roughness of about 0.25 nm.

In a second exemplary deposition process, niobium carbonitride was deposited using niobium pentafluoride as the transition metal precursor and 1,4-bis(trimethylsilyl)-1,4-dihydropyrazine as the second precursor. In the example, the second precursor was a reducing agent, a nitrogen donor and a carbon donor able to reduce the niobium of the transition metal precursor and donate nitrogen and carbon to it to form niobium carbonitride. In the example, a flow-type (i.e. cross-flow) ALD reactor was used. The pressure inside the reactor was from about 0.5 Torr to about 10 Torr during the process. The deposition process was performed at a temperature from about 200° C. to about 425° C. In an exemplary deposition process, a temperature of 425° C. was used. The transition metal precursor was provided in the reaction chamber (i.e. pulsed) from about 0.2 seconds to about 2 seconds, such as for 1 about second. The second precursor may be provided into the reaction chamber for about 1 seconds to about 5 seconds, such as for 4 about seconds. The process comprised a purge phase after each precursor pulsing phase. The length of the purge may be from about 0.2 to 3 seconds, such as for about 1 second.

$N_2$ (5.0) was used as a carrier gas and as a purge gas. The transition metal precursor was vaporized at a temperature between 40 and 45° C., and the second precursor was vaporized at a temperature between 30 and 40° C. Deposition was performed on soda lime glass and on silicon substrates with a native oxide layer. The growth rate of the transition metal carbide-containing material was approximately 1.0 Å/cycle, such as about 1.5 Å/cycle. Niobium carbonitride-containing layers may be obtained by the process, and the thickness of the layer depends on the number of pulsing cycles. For example, layers having thickness of at least 10 nm, such as at least 50 nm may be obtained.

In the exemplary process, the deposited transition metal carbonitride-containing material comprised crystalline hexagonal or cubic niobium carbonitride. The resistivity of the niobium carbonitride-containing layers was approximately between 150 and 250 μΩ cm.

The invention claimed is:

1. A method for forming a layer comprising transition metal carbide on a substrate, the method comprising:

providing a substrate into a reaction chamber;

executing at least one deposition cycle, wherein the at least one deposition cycle comprises:

providing a transition metal halide precursor in vapor phase into a reaction chamber; and providing a second precursor in vapor phase into a reaction chamber;

to form a layer comprising transition metal carbide on a substrate, wherein the second precursor comprises a cyclic diene compound comprising a substituent comprising metalloid, and wherein the second precursor is a carbon donor.

2. The method according to claim 1, wherein the transition metal halide precursor comprises a transition metal selected from the group consisting of Group IV to VIII transition metals.

3. The method according to claim 1, wherein the transition metal halide precursor comprises a transition metal selected from the group consisting of molybdenum, chromium, tungsten, nickel, cobalt, niobium, copper, titanium, palladium, platinum, zirconium, hafnium, vanadium, tantalum, manganese, rhodium, iron, iridium, and rhenium.

4. The method according to claim 1, wherein the transition metal halide precursor comprises a transition metal selected from the group consisting of the Group VI transition metals.

5. The method according to claim 1, wherein the transition metal halide precursor consists of only transition metal and halogen.

6. The method according to claim 1, wherein the halogen in the transition metal halide precursor is selected from the group consisting of chlorine, iodine, fluorine, and bromine.

7. The method according to claim 1, wherein the transition metal halide precursor comprises molybdenum pentachloride or niobium pentafluoride.

8. The method of claim 1, wherein the second precursor is a reducing agent.

9. The method of claim 1, wherein the substituent comprising metalloid is a trialkyl metalloid.

10. The method of claim 1, wherein the metalloid of the second precursor is germanium or silicon.

11. The method of claim 1, wherein the cyclic diene compound is a five or six membered cyclic diene.

12. The method of claim 1, wherein the second precursor comprises a cyclohexadiene compound of formula (I), (I)

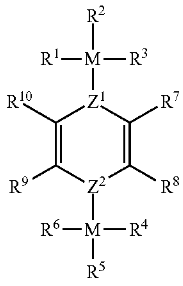

wherein M is either Ge or Si, each of $Z^1$ and $Z^2$ is independently selected from $CR^{11}$ and N, and each of $R^1$ to $R^{11}$ is independently H, C1 to C7 linear or branched alkyl, C6 to C10 aryl, or C6 to C14 heteroaryl.

13. The method of claim 12, wherein $R^{11}$ is H.

14. The method of claim 12, wherein each of $R^7$ to $R^{10}$ is independently selected from the group consisting of H, C1 to C4 linear and branched alkyl, and phenyl.

15. The method of claim 14, wherein all of $R^7$ to $R^{10}$ are H.

16. The method of claim 12, wherein each of $R^1$ to $R^6$ is independently selected from the group consisting of H, methyl, ethyl, n-propyl, and isopropyl.

17. The method of claim 16, wherein all of $R^1$ to $R^6$ are methyl.

18. The method of claim 1, wherein the second precursor comprises a cyclohexadiene compound of formula (II), (II)

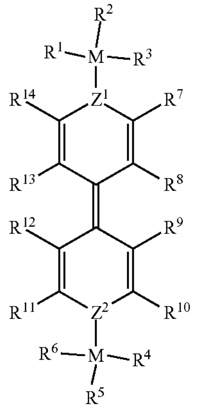

wherein M is either Ge or Si, each of $Z^1$ and $Z^2$ is independently selected from $CR^{15}$ and N, and each of $R^1$ to $R^{15}$ is independently H, C1 to C7 linear or branched alkyl, C6 to C10 aryl or C6 to C14 heteroaryl.

19. The method of claim 18, wherein $R^{15}$ is H.

20. The method of claim 18, wherein each of $R^7$ to $R^{14}$ is independently selected from the group consisting of H, C1 to C4 linear and branched alkyl, and phenyl.

21. The method of claim 20, wherein all of $R^7$ to $R^{14}$ are H.

22. The method of claim 18, wherein each of $R^1$ to $R^6$ is independently selected from the group consisting of H, methyl, ethyl, n-propyl, and isopropyl.

23. The method of claim 22, wherein all of $R^1$ to Re are methyl.

24. The method of claim 1, wherein the second precursor is selected from the group consisting of 1,4-bis(trimethylgermyl)-1,4-dihydropyrazine, 1,4-bis(trimethylsilyl)-1,4-dihydropyrazine, 1,1'-bis(trimethylsilyl)-1,1'-dihydro-4,4'-bipyridine, and 1,1'-bis(trimethylgermyl)-1,1'-dihydro-4,4'-bipyridine.

* * * * *